United States Patent [19]

Capasso et al.

[11] Patent Number: 4,590,507
[45] Date of Patent: May 20, 1986

[54] VARIABLE GAP DEVICES

[75] Inventors: Federico Capasso, Westfield; Arthur C. Gossard, Warren; Michael J. Stavola, Westfield, all of N.J.

[73] Assignee: AT&T Bell Laboratories, Murray Hill, N.J.

[21] Appl. No.: 636,155

[22] Filed: Jul. 31, 1984

[51] Int. Cl.⁴ .................... H01L 23/56; H01L 27/12
[52] U.S. Cl. ........................................ 357/28; 357/4; 357/16; 357/30; 357/88
[58] Field of Search ............... 357/4 SL, 4, 88, 28, 357/30, 16

[56] References Cited

U.S. PATENT DOCUMENTS 4,348,686  9/1982  Esaki .......................... 357/4 SL X
4,353,081 10/1982  Allyn et al. .................... 357/88 X
4,525,687  6/1985  Chemia et al. ................. 357/4 SL X
4,525,731  6/1985  Chappel et al. ............... 357/4 SL X

OTHER PUBLICATIONS

Döhler, "Solid State Superlattices", Scientific American, Nov. 1983, pp. 144–151.
Sourcebook of Pyroelectricity, Chapter I, Sidney Lang, Gordon and Breach Co., 1974, pp. 1–47.

Primary Examiner—Martin H. Edlow
Attorney, Agent, or Firm—Richard D. Laumann

[57] ABSTRACT

A device having a selectively doped varying bandgap region with pyroelectric characteristics is described which is useful as a photodetector or temperature sensor. A plurality of selectively doped regions forming a superlattice may also be used. Ferroelectric devices are also described.

19 Claims, 14 Drawing Figures

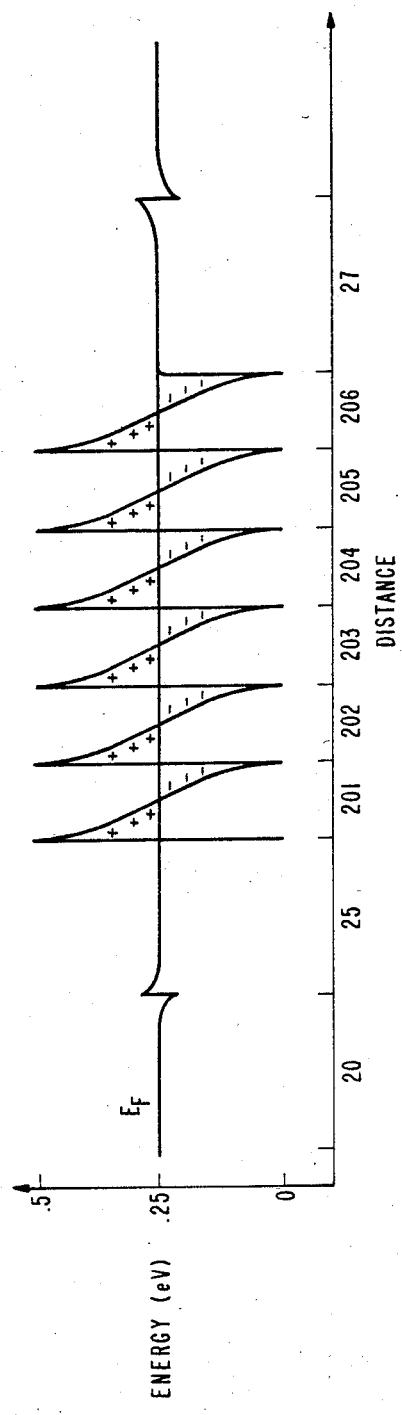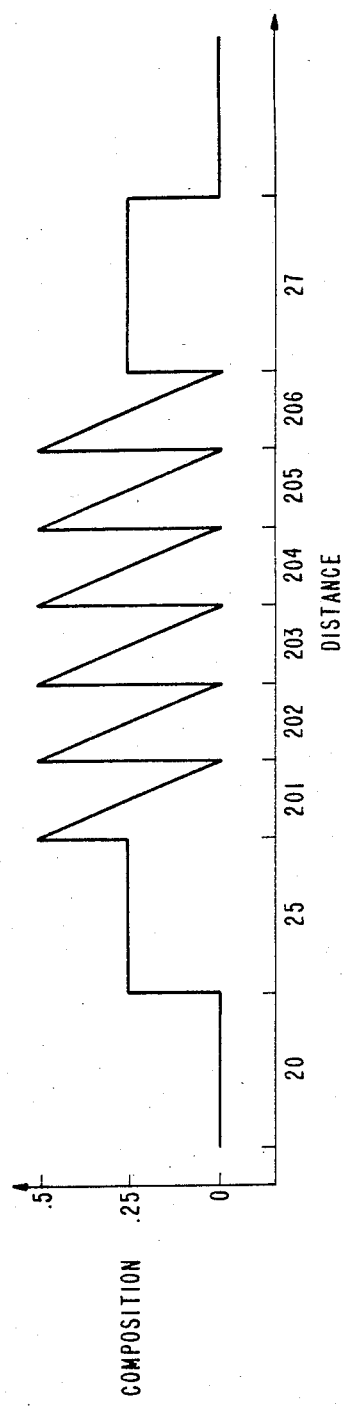

VARIABLE GAP DEVICES

TECHNICAL FIELD

This invention relates generally to semiconductor devices and particularly to such devices having a variable gap structure with broken symmetry upon reflection.

BACKGROUND OF THE INVENTION

In a large number of crystals, the center of positive charge does not coincide with the center of negative charge. Such crystals are not symmetric upon reflection and possess, in many cases, physically interesting properties. For example, they may possess a spontaneous electric polarization the magnitude of which depends upon the temperature of the crystal. Such crystals are termed pyroelectric by those skilled in the art.

A simple physical model is usefully discussed to explain the origin of pyroelectricity. Because the centers of the negative charges and positive charges do not coincide, each local structural unit will have a net electric dipole. If the crystal structure is such that the electric dipoles for all units do not cancel each other out, the structure will exhibit a spontaneous electrical polarization. This will happen if the orientations of the dipoles are not random, i.e., the orientations exhibit some degree of correlation. If the temperature of the structure is now increased or decreased, the strength of the dipoles is likely to change because the positions of the positive and negative charges with respect to each other vary as the charges acquire or lose thermal energy. See, for example, *Sourcebook of Pyroelectricity*, Chapter I, Sidney Lang, Gordon and Breach Co., 1974.

In some pyroelectric materials, the orientation of the electric dipoles in the crystal may be reversed by means of an applied external electric field. Thus, the direction of the electrical polarization may be changed. These materials are termed ferroelectrics by those skilled in the art and form a subset of pyroelectric materials. It will be appreciated that not all pyroelectrics have dipoles which can have their orientation reversed because, for example, the field required for reversal might have a magnitude greater than the electrical breakdown field of the material. Thus, not all pyroelectric materials are also ferroelectric materials.

Several naturally occurring crystals are ferroelectrics. First, there is Rochelle salt together with several chemically related salts. The origin of ferroelectricity in these materials is believed due to the water of hydration in the molecule. Second, there is a set of crystals which includes potassium dihydrogen phosphate and related salts. The ferroelectric behavior in these materials is related to the hydrogen bonds and the motion of the associated protons. Third, there is a class of ionic crystals with either the perovskite or ilemite structure. Barium titanate is an illustrative member of this class. Ferroelectric behavior is observed because the positive and negative charges are displaced with respect to each other and one type of charge has two possible lattice sites.

Ferroelectric and pyroelectric materials are thus fairly common in nature. These materials are of commercial interest because of their dielectric and piezoelectric properties. The materials often have, for example, very high dielectric constants. Other potential applications include temperature sensors and memory devices.

SUMMARY OF THE INVENTION

We have found that a device comprising a varying bandgap region having carriers in an asymmetric energy well has useful properties. The varying bandgap region is in a third semiconductor region between first and second semiconductor regions. The device has first and second electrical contacts to said first and second regions, respectively. In particular, we have found that a device comprising a plurality of varying bandgap regions that are selectively doped, i.e., a sawtooth superlattice region has useful pyroelectric properties. The third region has at least one varying bandgap region and is selectively doped so that the carriers and the dopant atoms are, energetically speaking on the average, on different sides of the Fermi level. A wide bandgap region, i.e., a confining region, provides carrier confinement, i.e., the carriers are in an energy well formed at the interface of the confining region and a varying bandgap region. The well is asymmetric in a preferred embodiment. The structure exhibits a macroscopic static electrical polarization because the center of charge of the electrons does not coincide with the center of charge of the ionized donors. In one preferred embodiment, the varying bandgap region comprises at least one graded bandgap layer with at least a portion of the energy band diagram of the layer being above the Fermi level and doped n-type. The carriers, which are in an asymmetric well, form a two-dimensional electron gas below the Fermi level. It will be appreciated that some carriers may have sufficient energy to be above the Fermi level at room temperature. In another embodiment, the carriers in the energy well are optically generated by photon absorption.

BRIEF DESCRIPTION OF THE DRAWING

FIG. 3 is the conduction band diagram of a pyroelectric superlattice device according to our invention;

FIG. 4 plots the composition in units of Al mole fraction for a device depicted in FIG. 3;

For reasons of clarity, the elements of the devices are not drawn to scale.

DETAILED DESCRIPTION

The structures of several embodiments of devices according to our invention will be described and then the energy band diagrams of several varying bandgap structures useful in the devices will be discussed to explain device operation.

Figure 1:
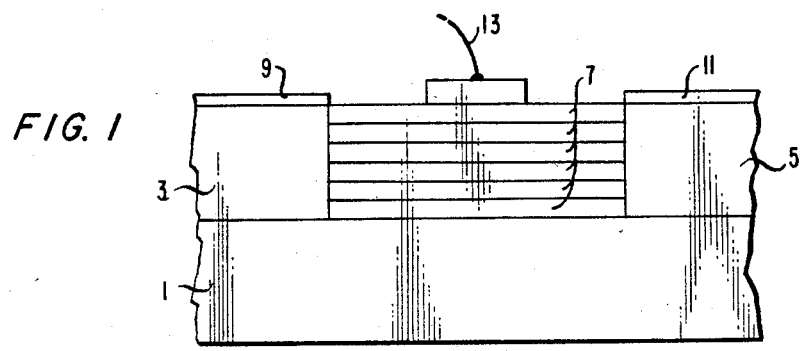
FIG. 1 is a sectional view of one embodiment of our invention.

FIG. 1 is a sectional view of one embodiment of a pyroelectric device according to our invention. The device comprises substrate 1, and disposed thereon, a first semiconductor region 3, a second semiconductor region 5, and a third, varying bandgap, semiconductor region 7 which is between regions 3 and 5. Regions 3 and 5 may have either the same or opposite conductivity types. The substrate is desirably semi-insulating or insulating. The third region is a superlattice comprising a plurality of regions having a varying bandgap and being selectively doped so that the centers of positive and negative charge do not coincide. Substrate 1 may also serve as a carrier confining region if there is an energy well adjacent the substrate. Regions 3, 5 and 7 are electrically contacted by contacts 9, 11 and 13, respectively. Contacts 9 and 11 are conventional ohmic contacts. Contact 13 may be fabricated by any of the conventional technologies, for example, metal-insulator or metal, used to fabricate gates on field effect transistors.

Figure 2:
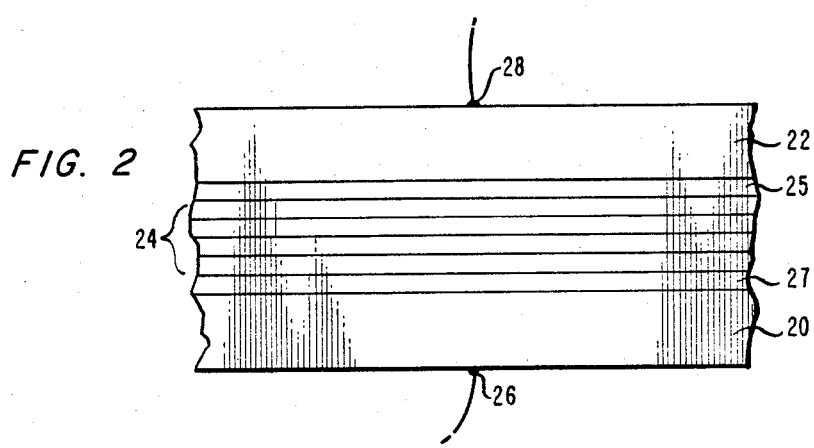
FIG. 2 is a sectional view of another embodiment of our invention.

FIG. 2 is a sectional view of another embodiment according to our invention. The device depicted comprises first semiconductor region 20, second semiconductor region 22 and a third region 24 between these two regions. Also present are waveguiding layers 25 and 27. The third region is similar to that in FIG. 1. Regions 20 and 22 may have either the same or opposite conductivity type. Waveguiding regions 25 or 27 may be omitted if desired. These regions have refractive indices less than the refractive indices of the adjacent varying bandgap region. Region 27 has a bandgap greater than the bandgap of the adjacent portion of the superlattice region. Region 27 may be omitted if region 20 has a larger bandgap than the adjacent superlattice region. That is, either region 20 or region 27 will be a carrier confining region. Regions 20 and 22 are electrically contacted by contacts 26 and 28, respectively.

The regions comprise semiconductors such as Group III-V compound semiconductors which are expediently fabricated with graded bandgaps and selective doping. Semiconductors such as $Al_xGa_{1-x}As$, AlAs, $(Al_xGa_{1-x})_yIn_{1-y}As$, $Ga_xIn_{1-x}P_yAs_{1-y}$, $Al_xGa_{1-x}Sb$, AlSb, and GaSb may be used. $Hg_{1-x}Cd_xTe$ may also be used. The devices are expediently fabricated by, for example, growing the layers by molecular beam epitaxy and using conventional processing techniques.

Our invention will be better understood by reference to an exemplary energy band diagram of the third region which forms a superlattice. For reasons of simplicity, the energy band diagrams plot the conduction band. Unless otherwise stated, all conduction band diagrams are depicted at zero applied bias. Such a conduction band diagram is depicted in FIG. 3 with the energy plotted vertically in arbitrary units versus the distance normal to the superlattice regions horizontally. Six superlattice regions 201, 202, 203, 204, 205 and 206 are depicted as well as regions 25 and 27 and substrate 20. The Fermi level is indicated as $E_F$. Although the superlattice region depicted comprises six graded bandgap regions, it is to be understood that more or fewer regions may be usefully employed in some embodiments. The portion of the region with the energy band diagram below the Fermi level forms an energy well for electrons.

The conduction band grading depicted is conveniently obtained by varying the semiconductor composition. For example, $Al_xGa_{1-x}As$ may be used with x varying from 0.0 to 0.5. Other semiconductors may, of course, be used. The compositional variation in units of Al more fraction is depicted in FIG. 4. The waveguiding regions are typically 5000 Angstroms thick and the graded bandgap regions are typically 50 to 1000 Angstroms thick. If the regions are too thin, unwanted tunneling will occur between energy wells. If the regions are too thick, there will not be any quantized energy states.

The regions are selectively doped with a portion of the energy band diagram of the regions above the Fermi level being n-type, that is, it has donors. Approximately half of each graded bandgap region is doped n-type with a concentration of typically between $5 \times 10^{16}/cm^3$ to $5 \times 10^{18}/cm^3$. In general, it is desirable to have a carrier density in the energy well between approximately $10^{10}/cm^2$ and approximately $10^{12}/cm^2$.

In the equilibrium state, the electrons from the donor atoms fill the portion of the energy band diagram of the conduction band below the Fermi level thus leaving a net positive charge in the portion of the structure with the conduction band above the Fermi level. The electrons form a two-dimensional electron gas. As is evident, the center of positive charge does not coincide with the center of the negative charge and the device thus has a net electric dipole moment and is a pyroelectric device.

It will also now be appreciated that the center of negative charge will change as electrons are excited into higher energy states. When electrons are excited, their energy states will change and because of the asymmetric structure of the regions and the resulting energy wells, their average position will also change. This, of course, changes the electric dipole moment and thus the net electrical polarization. The electrons may be excited in any of several ways such as, for example, thermal, i.e., heating or cooling; optical, i.e., absorption; or electrical, i.e., an electric field perpendicular or parallel to the regions, means may be used. The internal polarization, which is dynamically detectable, is thus modulated. The devices are thus useful as temperature sensors and photodetectors. The gate permits the electron well shape and depth to be varied and thus varies the electron transport properties between regions 3 and 5.

The presence of a varying bandgap region in which the electrons are confined, i.e., the asymmetric energy well, is essential. For example, if the electrons were confined in a square or other symmetrically shaped well, their average positions will not change as they receive energy and the dipole moment will not vary.

Alternatively, the regions may be selectively doped with acceptors. In such embodiments, the two dimensional gas comprises holes, which, in the energy band diagram, preferentially fill the energy band diagram above the Fermi level. This type of doping will be desirable when most of the energy bandgap difference is in the valence band.

Figure 5:
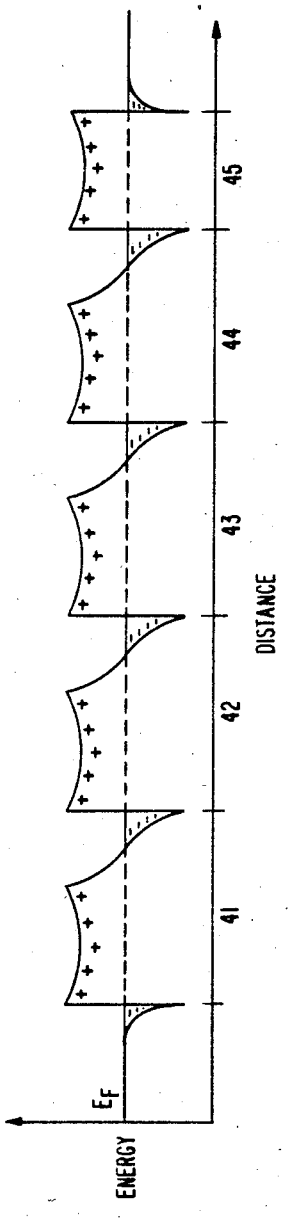
FIG. 5 is the conduction band diagram of another pyroelectric superlattice device according to our invention.

Other energy band structures are possible for the third region. FIG. 5 illustrates the conduction band for yet another embodiment in which the third region comprises a superlattice with a plurality of regions. Four superlattice regions 41, 42, 43, and 44 are depicted although it will be understood that more or fewer may be used. Region 45 is a carrier confining region. In this embodiment, each superlattice region has a region of essentially constant bandgap which is doped n-type, between two adjacent graded regions. The graded bandgap regions comprise, for example, $Al_xGa_{1-x}As$ with a linear variation of x with distance. Again, the equilibrium states for the electrons are such that they are, on the average, below the Fermi level and form a two-dimensional electron gas which is spatially separated from the donor atoms. The dip in the conduction band of the constant bandgap region arises because of the space charge of the ionized donors. Thus, the center of positive charge does not coincide with the center of negative charge and the device is pyroelectric. Different compositional variations may be used. For example, a parabolic compositional variation can be used.

Figure 6:
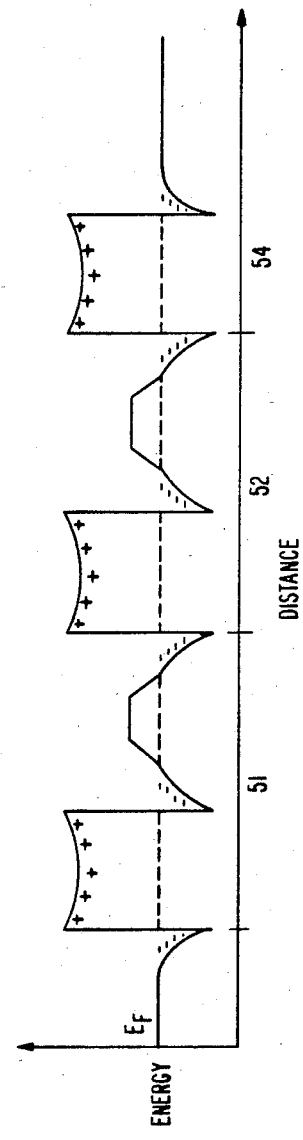
FIG. 6 is the conduction band diagram of a ferroelectric superlattice device according to our invention.

FIG. 6 illustrates the conduction band diagram of a ferroelectric superlattice region according to our invention. Two varying bandgap superlattice regions 51 and 52 are depicted. Region 54 is a carrier confining region. Each region has a region of relatively constant bandgap which is doped n-type. Between the constant bandgap regions, there is a varying bandgap region which has a maximum energy above the Fermi level and two minima below the Fermi level. Thus, each superlattice region has two electron wells lying below the Fermi level between each constant bandgap region of the superlattice structure. The resulting structure may have the direction of the net electric dipole moment reversed by an applied electric field and is thus a ferroelectric.

Figure 7:
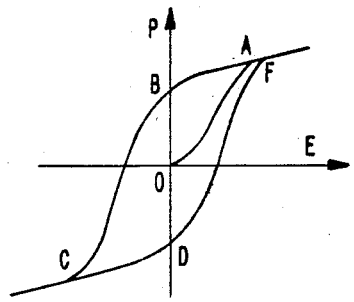
FIG. 7 shows a hysteresis loop for an exemplary ferroelectric device.

FIG. 7 illustrates an exemplary hysteresis loop of the device with the electric field plotted horizontally and the polarization plotted vertically.

Figure 8:
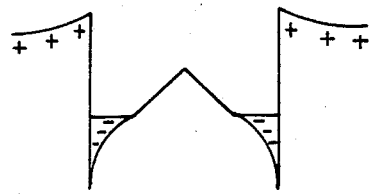
FIGS. 8–12 are conduction band diagrams of a ferroelectric superlattice device according to our invention that is useful in explaining the polarization hysteresis curve in the device.
Figure 9:
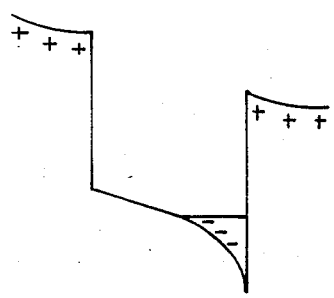
Figure 12:
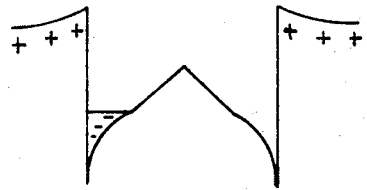

This may be better understood by reference to FIGS. 8–12 which illustrate the polarization reversal of the device under the influence of an external electric field. For reasons of simplicity, only a single superlattice region is depicted. The device has two wells for electrons between the constant bandgap regions. Each well is initially occupied by electrons. FIG. 8 illustrates the equilibrium state of the charge carriers as the device is originally fabricated, that is with no applied electric field. This corresponds to point O, i.e., the origin, in FIG. 7. If an electric field is now applied perpendicular to the layer and increased in magnitude, the reflection symmetry of the well is broken and the structure is electrically polarized as the electrons leave one well and move to the second well. The polarization increases along the line OA. Eventually, above a certain value of the electric field, A, the polarization tends to saturate. This situation is depicted in FIG. 9. At this point, all electrons have moved from one well to the other well. If the applied electric field is now reduced to zero, the energy band diagram depicted in FIG. 10 results. This corresponds to point B in FIG. 7. Although the electric field is now the same as it was in FIG. 8, it should be noted that there is a remanent polarization in this situation. That is, the superlattice remains polarized as all the electrons remain in one well. If the electric field is now increased in the direction opposite to that depicted in FIG. 9, polarization reversal occurs, i.e., the electrons move to the well unoccupied in FIG. 10. The polarization moves along the line BC. Saturation eventually occurs and the energy band diagram depicted in FIG. 11 results. Saturation occurs at point C in FIG. 7. Again, if the electric field is now reduced to zero, there is a remanent polarization as depicted in FIG. 12. This corresponds to point D in FIG. 7. That is, the electrons remain in one well. It will be readily appreciated by those skilled in the art that the ferroelectric superlattice thus possesses a hysteresis loop. If the electric field is again increased, the polarization moves along the curve DF. It will be readily understood that such a device may be used as a memory device.

Figure 10:
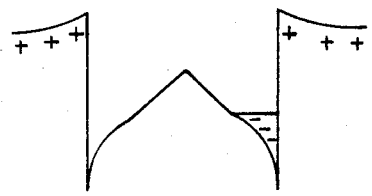
Figure 11:
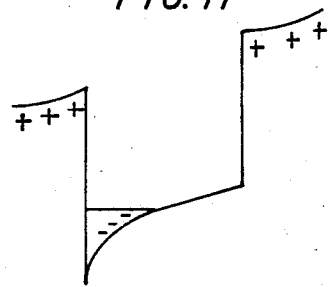

The conduction band diagram depicted in FIG. 10 is of further interest for the following device application. If the voltage between regions 3 and 5 is increased, the electrons in the energy well acquire energy and move in the direction parallel to the superlattice region. When they acquire sufficient energy, i.e., when the voltage is great enough, they will move to the adjacent well. The device is thus a real space electron transfer device. If the electron mobilities in the two wells differ, the device will exhibit negative differential resistance.

Figure 13:
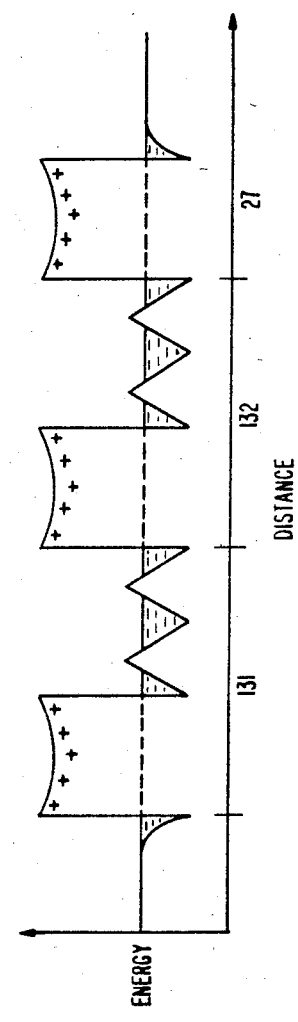
FIG. 13 is the conduction band diagram of another ferroelectric superlattice device according to our invention.

FIG. 13 depicts yet another ferroelectric superlattice energy band diagram. Two superlattice regions 131 and 132 are depicted. Region 27 is a carrier confining region. Each region has a constant bandgap region and between constant bandgap regions, a varying bandgap region having two local maxima and three local minima. The varying bandgap region is adjacent the constant bandgap region of the next superlattice region. It will be noted, however, that this is a tristable device as there are three electron wells between the constant bandgap regions and the device may be biased so that the electrons are in any of the three wells. Operation of this device is similar to that of the device depicted in FIG. 10 although it will be readily understood that the hysteresis curve is considerably more complicated.

Figure 14:
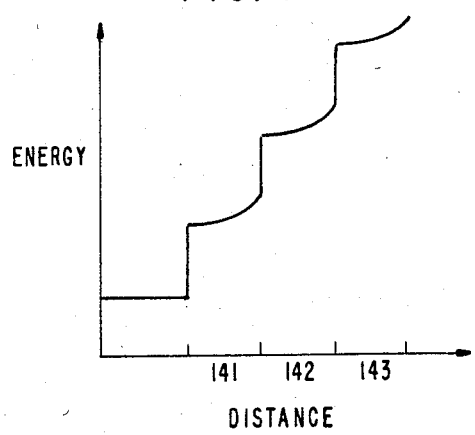
FIG. 14 is the conduction band diagram for an exemplary capacitor according to our invention.

FIG. 14 is the conduction band diagram of a sawtooth superlattice under bias. Three varying bandgap regions 141, 143, and 145 are depicted. The superlattice is inserted between a p-n junction, i.e., the first and second semiconductor regions have opposite conductivity types and the p-n junction is reverse biased.

At a certain reverse bias voltage, the energy band diagram becomes a staircase as shown in FIG. 14. The electrons are removed from the wells and the superlattice becomes free of carriers. This corresponds to a steep drop in device capacitance and the device may be used as a varactor diode.

Although our invention has been described by reference to embodiments using selective doping to produce carriers in wells below the Fermi level, it will be appreciated that other techniques may be used. For example, the superlattice layers may be undoped and the carriers put into wells by the absorption of photons. Of course, the recombination time for electrons and holes should be greater than the time required for useful device operation. Additionally, the superlattice regions may be uniformly doped in which case dopants on the high energy sides of the wells will transfer charges to the low energy sides below the Fermi energy. Again, only one varying bandgap layer need be present.

What is claimed is:

1. A device comprising first and second semiconductor regions, first and second electrical contacts to said first and second regions, respectively, a third region between said first and second semiconductor regions, said third region comprising at least one graded bandgap region, a confining region adjacent said third region, said confining region and said third region forming a carrier confining energy well.

2. A device as recited in claim 1 in which said third region comprises a selectively doped region with the energy levels of the carriers and the dopant atoms being on different sides of the Fermi level at zero applied bias.

3. A device as recited in claim 2 in which said first and second contacts apply an electric field parallel to said third region.

4. A device as recited in claim 2 in which said first and second contacts apply an electric field perpendicular to said third region.

5. A device as recited in claim 2 further comprising an electrical contact to said third region, said contact applying an electric field perpendicular to said region of said superlattice.

6. A device as recited in claim 2 in which said first and second regions have the same conductivity type.

7. A device as recited in claim 2 in which said first and second regions have opposite conductivity type.

8. A device as recited in claim 2 in which said selectively doped region is doped n-type.

9. A device as recited in claim 2 in which said selectively doped region is doped p-type.

10. A device as recited in claim 2 in which said third region comprises a constant bandgap region and a varying bandgap region, said constant bandgap region being doped.

11. A device as recited in claim 10 in which said doping is n-type.

12. A device as recited in claim 10 in which said doping is p-type.

13. A device as recited in claim 11 in which said varying bandgap region has a local maximum in the conduction band above the Fermi level thereby forming two electron wells.

14. A device as recited in claim 13 in which said varying bandgap region comprises two local maxima in the conduction band above the Fermi level thereby forming two electron wells.

15. A device as recited in claim 2 in which said third region comprises a superlattice, said superlattice comprising a plurality of regions, said regions comprising a selectively doped region with the energy levels of the carriers and the dopant atoms being on different sides of the Fermi level at zero applied bias.

16. A device as recited in claim 15 in which said superlattice regions comprise a constant bandgap region and a varying bandgap region, said constant bandgap region being said selectively doped region.

17. A device as recited in claim 6 in which said varying bandgap regions have local maxima in the conduction band above the Fermi level thereby forming two electron wells.

18. A device as recited in claim 17 in which said varying bandgap regions comprise two local maxima in the conduction band above the Fermi level thereby forming three electron wells.

19. A device as recited in claim 15 further comprising an electrical contact to said superlattice region.

* * * * *

UNITED STATES PATENT AND TRADEMARK OFFICE
CERTIFICATE OF CORRECTION

PATENT NO. : 4,590,507

DATED : May 20, 1986

INVENTOR(S) : Federico Capasso, Arthur C. Gossard and Michael J. Stavola

It is certified that error appears in the above-identified patent and that said Letters Patent is hereby corrected as shown below:

Column 5, Line 55, "remenant" should read --remnant";
Line 65, "remenant" should read--remnant--.
Column 8, Line 17, "6" should read --16--.

Signed and Sealed this

Ninth Day of September 1986

[SEAL]

Attest:

DONALD J. QUIGG

*Attesting Officer*     *Commissioner of Patents and Trademarks*